(12) United States Patent  
Vattikonda et al.

(10) Patent No.: US 8,934,278 B2
(45) Date of Patent: Jan. 13, 2015

(54) HYBRID TERNARY CONTENT ADDRESSABLE MEMORY

(71) Applicant: QUALCOMM Incorporated, San Diego, CA (US)

(72) Inventors: Rakesh Vattikonda, San Diego, CA (US); Nishith Desai, San Diego, CA (US); ChangHo Jung, San Diego, CA (US); Sei Seung Yoon, San Diego, CA (US); Esin Terzioglu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/730,487

(22) Filed: Dec. 28, 2012

(65) Prior Publication Data

US 2014/0185348 A1    Jul. 3, 2014

(51) Int. Cl.
    *G11C 15/04* (2006.01)
    *G11C 15/00* (2006.01)

(52) U.S. Cl.
    CPC ............... *G11C 15/00* (2013.01); *G11C 15/04* (2013.01)
    USPC ................ 365/49.17; 365/189.07; 365/49.16; 365/49.18

(58) Field of Classification Search
    USPC ........... 365/49.17, 189.07, 49.1, 49.18, 49.16
    See application file for complete search history.

(56) References Cited

U.S. PATENT DOCUMENTS

| | | | |
|---|---|---|---|
| 6,044,005 A | 3/2000 | Gibson et al. | |
| 6,385,070 B1 | 5/2002 | Peterson | |
| 6,400,593 B1 | 6/2002 | Lien et al. | |
| 6,411,538 B1 | 6/2002 | Kengeri | |
| 6,574,702 B2 | 6/2003 | Khanna et al. | |
| 6,760,242 B1 | 7/2004 | Park et al. | |
| 6,775,168 B1 | 8/2004 | Park et al. | |
| 7,050,318 B1* | 5/2006 | Argyres | ...................... 365/49.15 |
| 7,110,275 B2 | 9/2006 | Park | |
| 7,154,764 B2 | 12/2006 | Nataraj | |
| 7,286,379 B1 | 10/2007 | Sun | |
| 7,355,890 B1 | 4/2008 | Wen | |

(Continued)

FOREIGN PATENT DOCUMENTS

WO    WO-03056565 A1    7/2003

OTHER PUBLICATIONS

Chang, et al., "A low-power TCAM design using mask-aware match-line (MAML) technique", GLSVLSI '11: Proceedings of the 21st edition of the great lakes symposium on Great lakes symposium on VLSI, May 2011, 6 pgs.
Huang, et al., "Energy-Efficient Design for Ternary Content Addressable Memory", International Journal of Electrical Engineering, v 15, n 2, ISSN:18123031, Apr. 2008, p. 97-108.
K. Pagiamtzis and A. Sheikholeslami, "Content-Addressable Memory (CAM) Circuits and Architectures: A Tutorial and Survey," IEEE Journal of Solid-State Circuits, vol. 41, No. 3 Mar. 2006, pp. 712-727.

(Continued)

*Primary Examiner* — Richard Elms
*Assistant Examiner* — Mohammed A Bashar
(74) *Attorney, Agent, or Firm* — Paul S. Holdaway

(57) ABSTRACT

A method within a hybrid ternary content addressable memory (TCAM) includes comparing a first portion of a search word to a first portion of a stored word in a first TCAM stage. The method further includes interfacing an output of the first TCAM stage to an input of the second TCAM stage. The method also includes comparing a second portion of the search word to a second portion of the stored word in a second TCAM stage when the first portion of the search word matches the first portion of the stored word. The first TCAM stage is different from the second TCAM stage.

29 Claims, 10 Drawing Sheets

(56) References Cited

U.S. PATENT DOCUMENTS

| | | |
|---|---|---|
| 7,555,594 B2 | 6/2009 | Venkatachary |
| 7,940,541 B2 | 5/2011 | Ali et al. |
| 8,125,810 B2 | 2/2012 | Bosshart |
| 8,169,808 B2 | 5/2012 | Roohparvar |
| 8,582,338 B1 | 11/2013 | Argyres |
| 2005/0276086 A1 | 12/2005 | Perry et al. |
| 2009/0141580 A1 | 6/2009 | Evans et al. |
| 2009/0310395 A1 | 12/2009 | Chiang |
| 2012/0063189 A1 | 3/2012 | Maurya et al. |
| 2014/0177310 A1 | 6/2014 | Vattikonda et al. |
| 2014/0185349 A1 | 7/2014 | Terzioglu et al. |

OTHER PUBLICATIONS

Matsunaga, et al., "Design of a Low-Energy Nonvolatile Fully-Parallel Ternary CAM Using a Two-Level Segmented Match-Line Scheme", 41st IEEE International Symposium on Multiple-Valued Logic, 2011, pp. 99-104.

International Search Report and Written Opinion—PCT/US2013/076853—ISAEPO—Apr. 22, 2014.

Wang J.S., et al., "Design trend of energy-efficient CAMs," SoC Design Conference, 2008, ISSOCC '08, International, IEEE, Piscataway, NJ, USA, Nov. 24, 2008, pp. I-21-I-24,XP031449435, ISBN: 978-1-4244-2598-3.

* cited by examiner

US 8,934,278 B2

HYBRID TERNARY CONTENT ADDRESSABLE MEMORY

TECHNICAL FIELD

The present disclosure relates generally to a ternary content addressable memory (TCAM). More specifically, the disclosure relates to a hybrid architecture for a TCAM.

BACKGROUND

TCAMs are typically used in routers and Ethernet switches for Internet protocol (IP) address forwarding. The storage elements are typically designed using a dynamic NOR/NAND type cell.

Content addressable memory (CAM) supports a read operation, write operation, and compare operation. A compare bus of the same width (e.g., bits per word) as an entry in the CAM is input at a clock edge. The data of the compare bus is simultaneously compared to every entry in the CAM. That is, the comparison occurs parallel so the bus may be compared to every entry in the CAM during one clock cycle. An entry is a match when every bit in an entry matches the corresponding bit in the compare bus. Alternatively, an entry is a mismatch when any bit in an entry does not match the corresponding bit in the compare bus. The bits of the entries in the CAM are either 0 or 1.

A TCAM is similar to CAM with the addition of a mask value that may be stored in a cell. The mask value may be referred to as a local mask. A mask value is not compared with a compare bit, and therefore, the compare result will always be a match.

FIG. 1 illustrates an architecture of a conventional TCAM 100. As illustrated in FIG. 1, a search word, such as "1101," is input to a register 150 of the TCAM 100. The search word is compared to the value stored in the TCAM cells 110. TCAMs typically have sixteen TCAM cells per stage. The search is simultaneously conducted across the TCAM cells 110. The content of the TCAM cells 110 may be a high bit (1), a low bit (0), or a mask value (X). Prior to the search, a match line 130-136 for each set of TCAM cells 120-126 is set to high. The match lines 130-136 are input to a priority encoder 140. The TCAM 100 outputs (MLout) the address of the set of TCAM cells that match the search word line. Because the search is a parallel search, the search may be completed in one clock cycle. It should be noted that a mask value may be a 0 or 1, still, in the present disclosure, the mask value may be referred to as an X.

As an example, as illustrated in FIG. 1, a first set of TCAM cells 120 is set to "1 X 0 1," a second set of TCAM cells 122 is set to "1 0 X 1," a third set of TCAM cells 124 is set to "1 1 X X," and a fourth set of TCAM cells 126 is set to "1 X 1 X." When comparing the content of the TCAM cells to the search bit, when the content of the TCAM cell is a mask value X, the comparison will yield a match. Thus, according to the example illustrated in FIG. 1, the first set of TCAM cells 120 and the third set of TCAM cells 124 match the search word in the register 150. Accordingly, the match lines 130 134 of the first set of TCAM cells 120 and the third set of TCAM cells 124 will indicate a match and the priority encoder 140 outputs the address of the first set of TCAM cells 120 and the third set of TCAM cells 124.

The conventional TCAM architecture is a dynamic circuit and has a high dynamic power dissipation. In some cases, the TCAM may have a dynamic NAND architecture. In other cases, the TCAM may have a dynamic NOR architecture.

FIG. 2 illustrates a conventional dynamic NAND TCAM 200. As illustrated in FIG. 2, the dynamic NAND architecture 200 includes a match line $ML_{NAND}$ charged by a pre-charge line PRE# from a pull-up transistor 210. The match line $ML_{NAND}$ is connected to a series of intermediate match lines $ML_0$-$ML_{n-1}$. Each of the intermediate match lines $ML_0$-$ML_{n-1}$ is coupled to a mask cell $Mask_0$-$Mask_{n-1}$ and a key cell $Key_0$-$Key_{n-1}$ via a transmission gate. The transmission gate includes a key NMOS transistor 202 coupled to a key cell $Key_0$-$Key_{n-1}$ and a mask NMOS transistor 204 coupled to a mask cell $Mask_0$-$Mask_{n-1}$.

The content of the mask cells $Mask_0$-$Mask_{n-1}$ is illustrated in an expanded mask cell 222. As shown in the expanded mask cell 222, mask cells $Mask_0$-$Mask_{n-1}$ are SRAM cells including a mask value M, a mask value bar M#, a mask word line WLM, a mask bit line BLM, and a mask bit line bar BLM#. The content of the key cells $Key_0$-$Key_{n-1}$ is illustrated in an expanded key cell 220. As shown in the expanded key cell 220, the key cells $Key_0$-$Key_{n-1}$ are SRAM cells with XNOR logic. The key cells $Key_0$-$Key_{n-1}$ further include a search line SL, a search line bar SL#, a key bit line BLK, a key bit line bar BLK#, a key value K, a key bar value K#, and a key write line WLK.

In a dynamic NAND TCAM architecture, the match lines are pre-charged high and evaluate low to indicate a match. That is, a pre-charge signal is used for each match line during every cycle to set the match lines to high. Depending on the status of the mask cell or key cell, the match line may be pulled low or remain high. Each intermediate match line is associated with a mask cell and a key cell. Furthermore, each key cell further includes XNOR logic. The dynamic NAND TCAM uses a serial operation. Thus, an intermediate match line (n-1) may discharge when the previous intermediate match line (n-2) is pulled low to indicate a match. That is, the operation continues from one intermediate match line (n-2) to a subsequent intermediate match line (n-1) when there is a match and stops progressing through the intermediate match lines when there is a mismatch.

In a dynamic NOR TCAM architecture, match lines are pre-charged high and evaluate low to indicate a mismatch. The majority of comparisons yield a mismatch, and therefore, the dynamic NOR has an increased power consumption as a result of switching from high to low for indicating a mismatch. Furthermore, the dynamic NOR has a complex timing control because the pre-charge signal is used by each match line in each clock cycle.

FIG. 3 illustrates a conventional dynamic NOR TCAM 300. As illustrated in FIG. 3, the dynamic NOR TCAM 300 includes key cells $Key_0$-$Key_{n-1}$ and mask cells $Mask_0$-$Mask_{n-1}$. Typically, a NOR TCAM, such as the NOR TCAM 300 of FIG. 3, may have sixteen key and mask cells. Data is input via search lines ($SL_0$-$SL_{n-1}$ and $SL_0$#-$SL_{n-1}$#). The data is compared to the values stored in the key cells $Key_0$-$Key_{n-1}$ and mask cells $Mask_0$-$Mask_{n-1}$. The match line $ML_{NOR}$ is pre-charged high via the pre-charge line PRE# from a pull-up transistor 303. The match line $ML_{NOR}$ will evaluate low when there is a mismatch between the data input via one of the search lines ($SL_0$-$SL_{n-1}$ and $SL_0$#-$SL_{n-1}$#) and the data stored in one of the cells $Key_0$-$Key_{n-1}$ $Mask_0$-$Mask_{n-1}$. The match line remains high when the values of all of the cells $Key_0$-$Key_{n-1}$ $Mask_0$-$Mask_{n-1}$ match the input data.

The structure of the key cells $Key_0$-$Key_{n-1}$ is illustrated in the expanded key cell 330 and the structure of the mask cells $Mask_0$-$Mask_{n-1}$ is illustrated in the expanded mask cell 333. As illustrated in the expanded key cell 330, the key cells $Key_0$-$Key_{n-1}$ are implemented via an SRAM cell. During a compare operation, the key bar K# is ANDed with the search line SL. The key cells $Key_0$-$Key_{n-1}$ include a bit line BLK, a bit line bar BLK#, and a word line WLK.

As illustrated in the expanded mask cell 333, the mask cells $Mask_0$-$Mask_{n-1}$ are implemented via a SRAM cell. During a comparison operation, the mask bar M# is ANDed with the search line bar SL#. The mask cells $Mask_0$-$Mask_{n-1}$ include a bit line BLM, a bit line bar BLM#, and a word line WLM.

As discussed above, in a dynamic NOR TCAM, the match lines are pre-charged high at the beginning of every cycle and the match lines evaluate low to indicate a mismatch. The majority of comparisons of the cells in a TCAM yield a mismatch. Thus, the power consumption of the dynamic NOR TCAM is increased as a result of the switching from high to low when indicating a mismatch. In some cases, match lines may be pre-discharged low to reduce the power consumption. Still, even when then match lines are pre-discharged, a pre-charge operation charges the match line at the beginning of every cycle. Accordingly, the pre-charging of the match line leads to an increase in power consumption and additionally control circuitry.

SUMMARY

According to an aspect of the present disclosure, a method within a hybrid ternary content addressable memory (TCAM) is presented. The method includes comparing a first portion of a search word to a first portion of a stored word in a first TCAM stage. The method also includes comparing a second portion of the search word to a second portion of the stored word in a second TCAM stage when the first portion of the search word matches the first portion of the stored word. The first TCAM stage is different from the second TCAM stage.

According to another aspect of the present disclosure, a hybrid TCAM is presented. The hybrid TCAM includes a first TCAM stage configured to compare a first portion of a search word to a first portion of a stored word. The TCAM also includes a second TCAM stage configured to compare a second portion of the search word to a second portion of the stored word when the first portion of the search word matches the first portion of the stored word. The first TCAM stage is different from the second TCAM stage.

According to yet another aspect of the present disclosure, a hybrid TCAM is presented. The hybrid TCAM includes a first means for comparing a first portion of a search word to a first portion of a stored word. The hybrid TCAM further includes a second means for comparing a second portion of the search word to a second portion of the stored word when the first portion of the search word matches the first portion of the stored word. The first means for comparing is different from the second means for comparing This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

It is desired to provide a TCAM that has low power consumption with high performance. Aspects of the present disclosure provide a combination of a static NAND TCAM storage element and pseudo-NOR TCAM storage element that has low power consumption with high performance. A TCAM that uses a combination of a static NAND and pseudo-NOR may be referred to as a hybrid TCAM. In the present disclosure the static NAND TCAM storage element may be referred to as a static NAND TCAM and the pseudo-NOR TCAM storage element may be referred to as a pseudo-NOR TCAM.

According to the present disclosure, the pseudo-NOR TCAM does not use a complex timing control circuitry for a match line pre-charge because the match line (ML) is not pre-charged before each cycle. In the present aspect, the pseudo-NOR TCAM uses a pseudo NMOS gate that uses a PMOS transistor stack as a pull-up device and an NMOS transistor as a pull-down device. The pseudo NMOS gate may be referred to as the pseudo-NOR gate.

Figure 4:
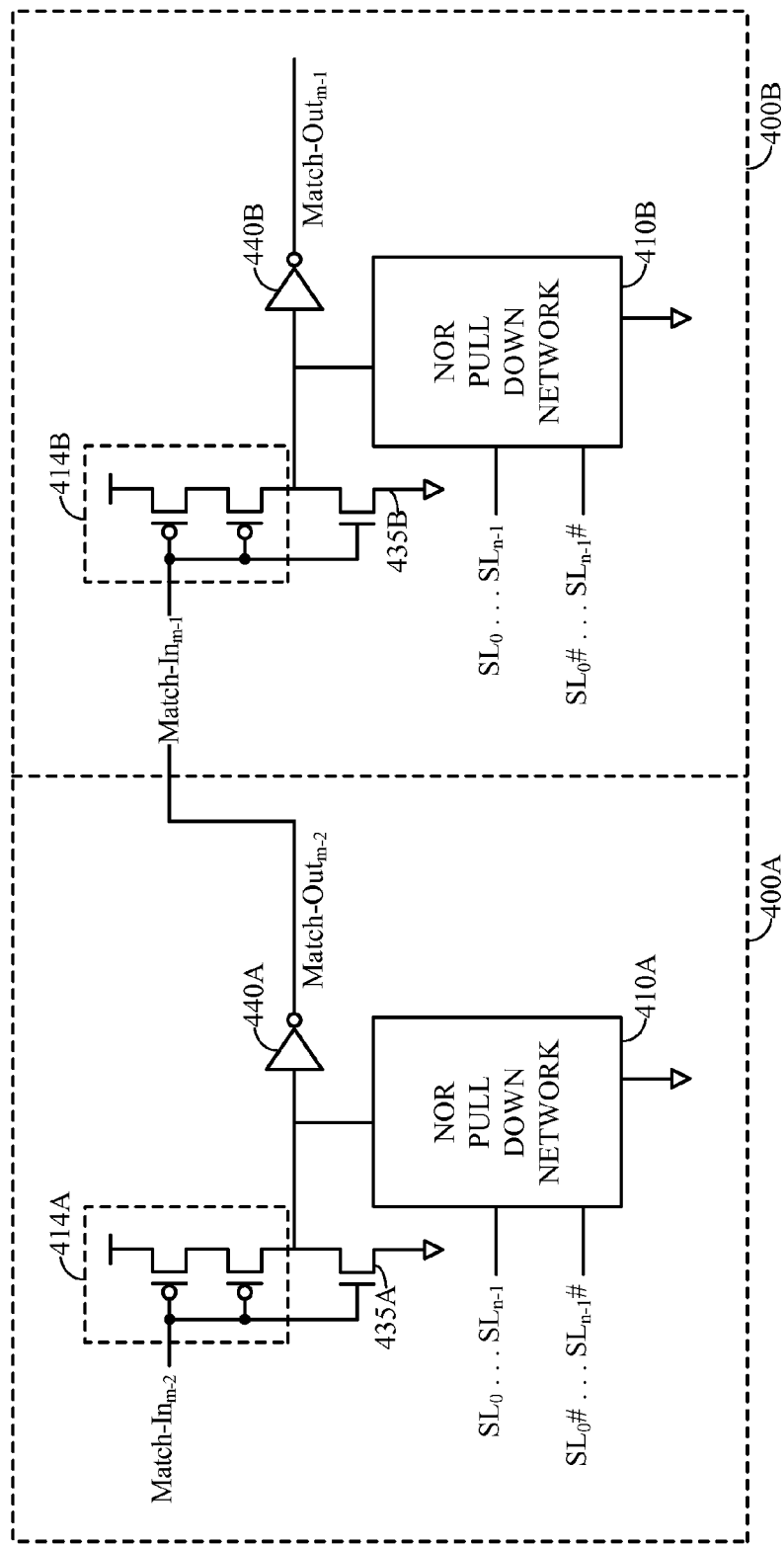
FIGS. 4 and 5 illustrate pseudo-NOR architectures according to aspects of the present disclosure.

FIG. 4 illustrates an architecture of pseudo-NOR TCAM stages 400A and 400B according to an aspect of the present disclosure. As illustrated in FIG. 4, the pseudo-NOR TCAM stage 400A includes a NOR pull down network 410A that receives inputs from a set of search lines $SL_0 \ldots SL_{n-1}$ and a complementary set of search lines $SL_0\# \ldots S_{n-1}\#$. Although FIG. 4 illustrates just two pseudo-NOR TCAM stages (400A and 400B), in implementation, a TCAM row (which stores a TCAM entry) may have m pseudo-NOR stages, each of the m pseudo-NOR stages having n cells. Consequently, each TCAM entry (stored in a TCAM row) may comprise n×m values stored by n×m cells. Each cell includes a mask cell and a key cell as described further below. Although the search line and search line bar inputs to pseudo-NOR TCAM stages 400A and 400B are both labeled the same way, each of the search line and search line bar inputs is unique.

Furthermore, the pseudo-NOR TCAM stage 400A may also include a match line output Match-out$_{m-2}$ and an inverter 440A coupled to the match line output Match-out$_{m-2}$. Moreover, the NOR pull down network 410A is further coupled to a PMOS stack 414A. The PMOS stack 414A includes two PMOS transistors and receives an input from the match line input Match-in$_{m-2}$. A pseudo-NOR may comprise the PMOS stack 414A and a pull-down transistor 435A. It should be noted that the PMOS stack 414A is not limited to two PMOS transistors. Aspects of the present disclosure contemplate a stack with only a single weak PMOS transistor, or a stack with more than two weak PMOS transistors.

It should be noted that the match line input (Match-in) is the match line output (Match-out) of a previous NOR pull down network (e.g., pseudo-NOR). That is, the match line input to a pseudo-NOR (pseudo-NOR TCAM stage 400B) is coupled to the match line output of a previous NOR stage (pseudo-NOR TCAM stage 400A). For example, as illustrated in FIG. 4, the match line output Match-out$_{m-2}$ of a pseudo-NOR TCAM stage 400A is the match line input Match-in$_{m-1}$ of a subsequent pseudo-NOR TCAM stage 400B. The architecture of the pseudo-NOR TCAM stages 400A and 400B of FIG. 4 is similar. Specifically, the pseudo-NOR TCAM stage 400B also includes a NOR pull down network 410B, pull-down transistor 435B, a PMOS stack 414B, and an inverter 440B. In the present disclosure, each pseudo-NOR (e.g., 400A and 400B) may be referred to as a TCAM stage.

In one configuration, the TCAM stages (e.g., pseudo-NOR TCAM stage 400A and pseudo-NOR TCAM stage 400B) may be connected serially to form a row of m TCAM stages (0 ... m-1). Each TCAM stage comprises n (0 ... n-1) search lines, key cells, and mask cells. The search line inputs for each pseudo-NOR (e.g., 400A and 400B) of FIG. 4 are exemplary inputs for the multiple search lines of a TCAM. It should be noted that in some aspects, the number of search lines, key cells, and mask cells may vary between each TCAM stage. That is, the n value for the (0 ... n-1) search lines, key cells, and mask cells of one TCAM stage, such as pseudo-NOR TCAM stage 400A, may not be the same as the n value for the (0 ... n-1) search lines, key cells, and mask cells of another TCAM stage, such as pseudo-NOR TCAM stage 400B.

Power is saved by serially connecting the pseudo-NORs. Specifically, connecting the gates of the pull-up transistors (e.g., PMOS stack) to a match line output of a previous pseudo-NOR saves power because the previous match line output acts as a control signal to turn off the pull-up transistors when a comparison is not specified (e.g., when the previous match line output/match line input indicates that the previous comparison was a mismatch). More specifically, the serial connection to the PMOS stack of the NOR pull down networks is a component of a pseudo-NOR that replaces the pre-charge and/or the pre-discharge of a conventional dynamic NOR.

The pseudo-NOR provides higher speeds and a lower transistor count in comparison to a conventional NOR architecture of a TCAM. Still, the pseudo-NOR has a static power consumption because of the pull-up transistor (PMOS stack) and has a reduced output voltage swing. Nonetheless, the overall speed improvement of the pseudo-NOR is still desirable in view of the increase of static-power consumption. It should be noted that the pull-up transistor(s) of the pseudo-NOR should be wide enough to conduct leakage of a NMOS-block and narrow enough for the NMOS-block to safely pull down the output.

Figure 5:
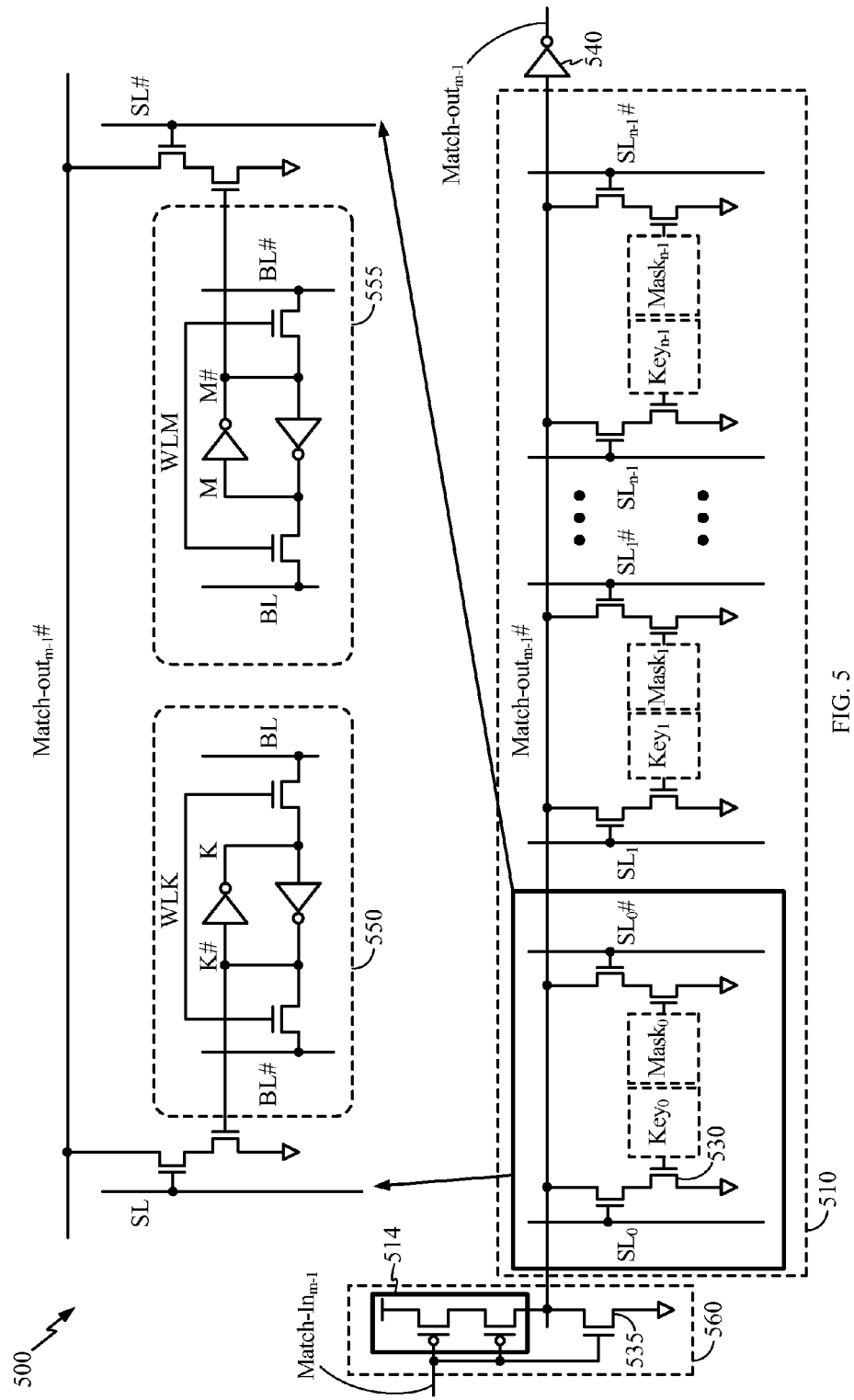

FIG. 5 illustrates an exemplary pseudo-NOR TCAM stage 500 according to aspects of the present disclosure. The pseudo-NOR TCAM stage 500 is an expanded view of a pseudo-NOR stage, such as pseudo-NOR TCAM stages 400A and 400B of FIG. 4.

As illustrated in FIG. 5, the pseudo-NOR TCAM stage 500 includes an inverter 540 coupled to a match line output Match-out$_{m-1}$, a PMOS stack 514 coupled to a match line input Match-in$_{m-1}$, and a pull-down transistor 535 coupled to a match line input Match-in$_{m-1}$, and a NOR pull down network 510. The NOR pull down network 510 includes key cells Key$_0$-Key$_{n-1}$ and mask cells Mask$_0$-Mask$_{n-1}$. Exemplary structures of the key cells and mask cells are illustrated in more detail in the expanded key cell 550 and expanded mask cell 555.

In operation, data is presented via search lines (SL$_0$-SL$_{n-1}$ and SL$_0$#-SL$_{n-1}$#). The data is compared to the values stored in the key cells Key$_0$-Key$_{n-1}$ and mask cells Mask$_0$-Mask$_{n-1}$. As illustrated in the expanded key cell 550, the key cells Key$_0$-Key$_{n-1}$ can be implemented with an SRAM cell. During a compare operation, the key bar K# is logically ANDed with the search line SL. The key cells Key$_0$-Key$_{n-1}$ include bit lines BL BL# and a key word line WLK. As illustrated in the expanded mask cell 555, the mask cells Mask$_0$-Mask$_{n-1}$ can be implemented via an SRAM cell. During a comparison operation, the mask bar M# is logically ANDed with the search line bar SL#. The mask cells Mask$_0$-Mask$_{n-1}$ include bit lines BL BL# and a mask word line WLM. That is, the mask cells Mask$_0$-Mask$_{n-1}$ and key cells Key$_0$-Key$_{n-1}$ may each share respective bit lines but may use their own word lines, i.e., different wordlines.

The pseudo-NOR TCAM stage 500 further includes an input stage 560 coupled to the match line bar Match-out$_{m-1}$#. The input stage 560 receives an input Match-in$_{m-1}$ from a match line output Match-out$_{m-2}$ of a previous pseudo-NOR stage. As previously discussed, the input stage 560 can include a pull-down transistor 535 and a PMOS stack 514. In some cases, pseudo-NOR functionality specifies the use of the input stage 560 and the NOR pull down network 510. Finally, an inverter 540 is coupled to the end of the match line bar Match-out$_{m-1}$#. The output from the inverter 540 is the match line output Match-out$_{m-1}$.

TABLE 1 is a truth table for the masking bit and key bit. It should be noted that the state in TABLE 1 refers to the state of a storage element (key cell and mask cell). The state is 0 when the key bit has a value of 0 and the mask bit has a value of 1, the state is 1 when the key bit has a value of 1 and the mask bit has a value of 0, and the state is X when both the mask bit and the key bit are 1. The state of X refers to a mask state in which there is neither a match nor a mismatch, rather, there is no comparison between the value of the search line and the values of the mask cell and key cell. Thus, the match line always indicates a match when the state is X.

TABLE 1

| State | Mask Bit (M) | Key Bit (K) |
|---|---|---|
| 0 | 1 | 0 |
| 1 | 0 | 1 |
| X | 1 | 1 |
| Not Allowed | 0 | 0 |

TABLE 2 is a truth table for the pseudo-NOR and uses the state values of TABLE 1.

TABLE 2

| Match-in$_{m-1}$ | State | SL$_{n-1}$ | SL$_{n-1}$# | Match-out$_{m-1}$ |
|---|---|---|---|---|
| 1 | 1/0/X | X | X | 1 |
| 0 | 0 | 0 | 1 | 0 |
| 0 | 0 | 1 | 0 | 1 |
| 0 | 1 | 0 | 1 | 1 |
| 0 | 1 | 1 | 0 | 0 |
| 0 | X | X | X | 0 |

As shown in TABLE 2, the match line output Match-out$_{m-1}$ will be 0 (low) to indicate a match. A match occurs when the values of the state and search line SL$_{n-1}$ are equal. Furthermore, when the state is X, the match line output Match-out$_{m-1}$ will also be low to indicate a match. Finally, the match line output Match-out$_{m-1}$ will be 1 (high) to indicate a mismatch. A mismatch occurs when the value of the state is not equal to the value of the search line SL$_{n-1}$.

The match line output Match-out$_{m-1}$ of TABLE 2 is the output of the inverter 540 of the pseudo-NOR TCAM stage 500. As shown in FIG. 5, a match line bar Match-out$_{m-1}$# precedes inverter 540. The match line bar Match-out$_{m-1}$# will evaluate low when there is a mismatch. That is, in order to disable further comparisons of the serially connected pseudo-NORs (e.g., 400A and 400B), the input stage 560 of a subsequent pseudo-NOR is specified to receive a high input that will activate the pull-down transistor 535 to pull the match line bar Match-out$_{m-1}$# of a subsequent pseudo-NOR to low. Thus, the inverter 540 will change the match line bar Match-out$_{m-1}$# from a low signal to a high signal in order to disable a subsequent pseudo-NOR.

TABLE 2 further shows the results of receiving a match line input Match-in$_{m-1}$ that is set to high. As shown in TABLE 2, when the match line input Match-in$_{m-1}$ is high, the state is 1/0/X because there will be no evaluations. Furthermore, the match line output Match-out$_{m-1}$ will also be high to disable a subsequent pseudo-NOR 400.

Alternatively, when the match line input is low, the PMOS stack 514 is activated and the match line bar Match-out$_{m-1}$# is evaluated high. If all the comparison results match, then the match line bar Match-out$_{m-1}$# will remain high and the match line output Match-out$_{m-1}$ will be low. If the comparison results in a mismatch, the match line bar Match-out$_{m-1}$# will evaluate low and the match line output Match-out$_{m-1}$ will be high to disable a subsequent pseudo-NOR.

The disabling of a pseudo-NOR reduces the overall power consumption of the TCAM because the subsequent comparisons are disabled when there is a mismatch. That is, unlike the dynamic NOR that pre-charges match lines and search lines for each NOR pull down network regardless of the comparison results of the previous comparison, the pseudo-NOR only proceeds with subsequent comparisons when the previous comparison resulted in a match. Moreover, the pseudo-NOR does not pre-charge match lines and search lines. Accordingly, aspects of the present disclosure reduce the overall power consumption of the TCAM and further reduce the complexity of the control circuitry and timing.

Figure 6:
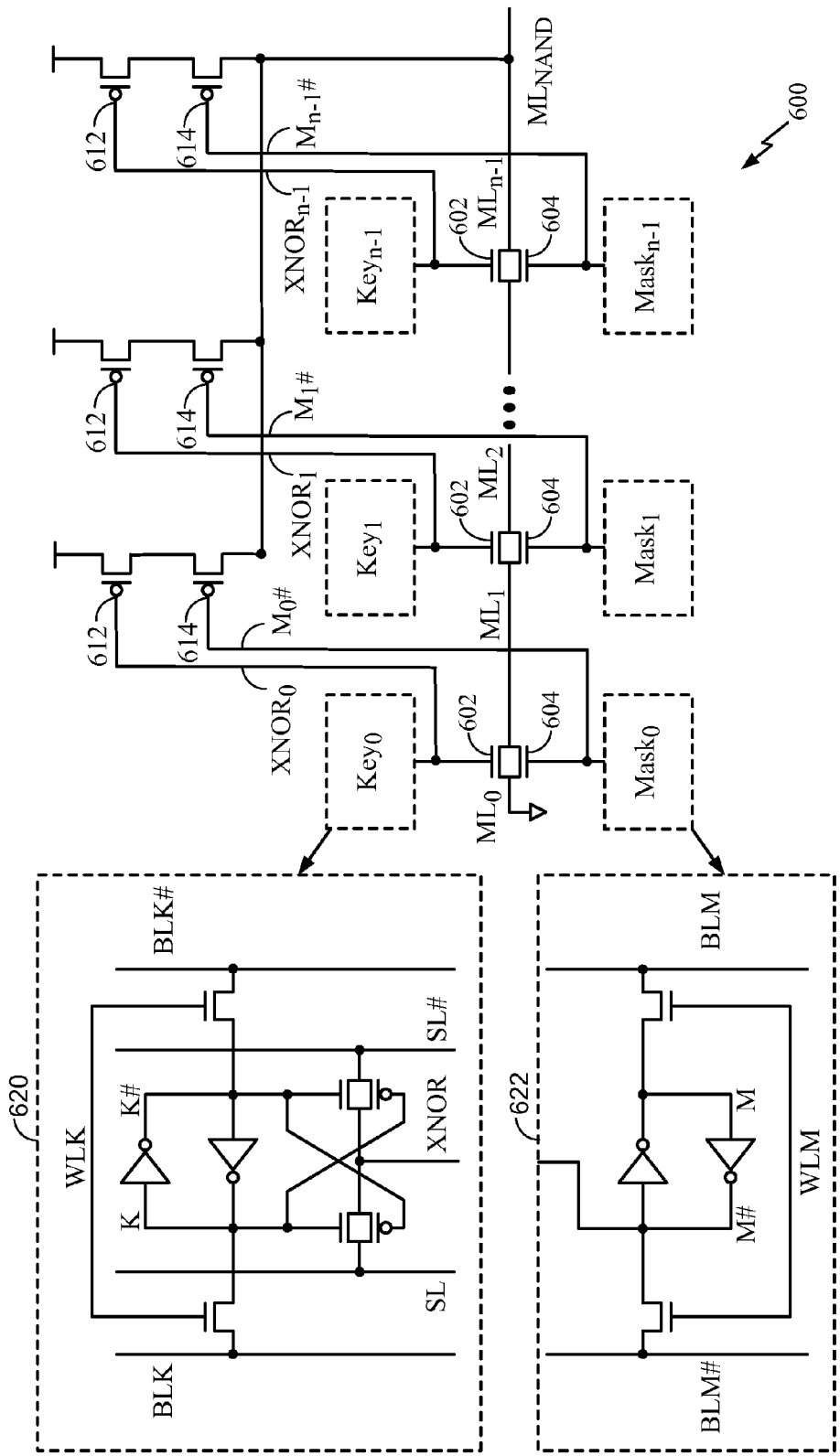
FIG. 6 illustrates a static NAND architecture according to an aspect of the present disclosure.

FIG. 6 illustrates an architecture of a static NAND TCAM 600 according to an aspect of the present disclosure. As illustrated in FIG. 6, a match line output ML$_{NAND}$ is connected to a series of intermediate match lines ML$_0$-ML$_{n-1}$. Each of the intermediate match lines ML$_0$-ML$_{n-1}$ is coupled to a mask cell Mask$_0$-Mask$_{n-1}$ via a first pull-down transistor, such as mask NMOS transistor 604, and a key cell Key$_0$-Key$_{n-1}$ via a second pull-down transistor, such as key NMOS transistor 602. The pull-down transistors are connected in parallel. The content of the mask cells Mask$_0$-Mask$_{n-1}$ is illustrated in an expanded mask cell 622. As shown in the expanded mask cell 622, the mask cells Mask$_0$-Mask$_{n-1}$ are SRAM cells including a mask bit M, a mask bit bar M#, a mask word line WLM, a mask bit line BLM, and a mask bit line bar BLM#. The content of the key cells Key$_0$-Key$_{n-1}$ is illustrated in an expanded key bit cell 620. As shown in the expanded key bit cell 620, the key cells Key$_0$-Key$_{n-1}$ are SRAM cells with XNOR logic. The key cells Key$_0$-Key$_{n-1}$ further include a search line SL, a search line bar SL#, a key bit line BLK, a key bit line bar BLK#, a key bit K, a key bit bar K#, a key write line WLK, and an output line XNOR.

Furthermore, each of the key cells Key$_0$-Key$_{n-1}$ is coupled to a first PMOS transistor 612 and each of the mask cells Mask$_0$-Mask$_{n-1}$ is coupled to a second PMOS transistor 614. Each first PMOS transistor 612 is coupled to a respective key cell Key$_0$-Key$_{n-1}$ via an XNOR line (XNOR$_0$-XNOR$_{n-1}$), and each second PMOS transistor 614 is coupled to a respective mask cell Mask$_0$-Mask$_{n-1}$ via a mask bit line bar (M$_0$#-M$_{n-1}$#). The first PMOS transistor 612 and second PMOS transistor 614 are also coupled to the match line output (ML$_{NAND}$). The first PMOS transistor 612 and second PMOS transistor 614 are connected in series and may be referred to as a serial PMOS transistors. Thus, according to an aspect of the present disclosure, each cell pair (e.g., one mask cell and one key cell) is coupled to parallel NMOS transistors (e.g., key NMOS transistor 602 and mask NMOS transistor 604) and serial PMOS transistors (e.g., first PMOS transistor 612 and second PMOS transistor 614).

Figure 1:
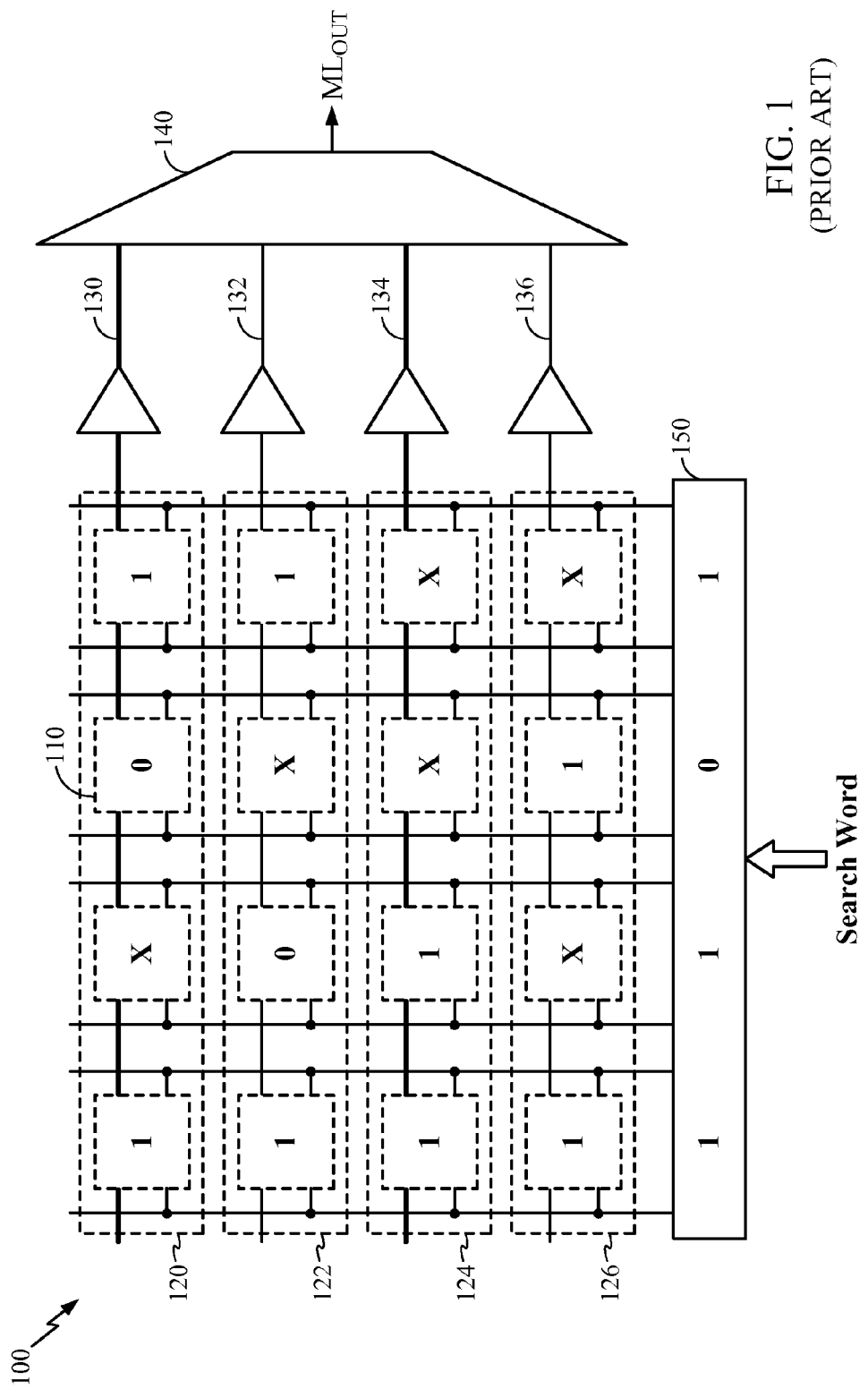
FIG. 1 illustrates a TCAM memory system.
Figure 2:
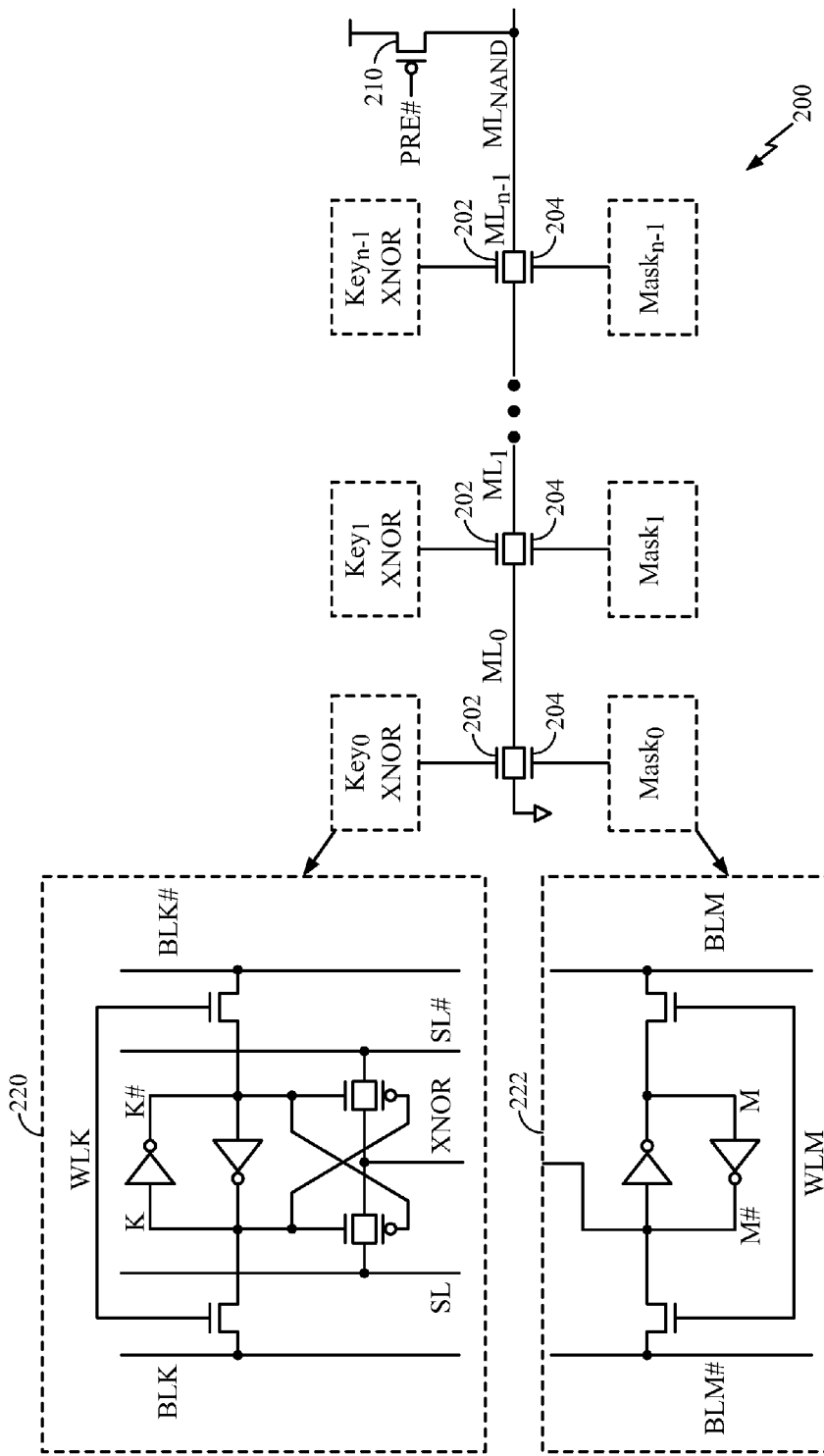
FIG. 2 illustrates a prior art dynamic NAND architecture.
Figure 3:
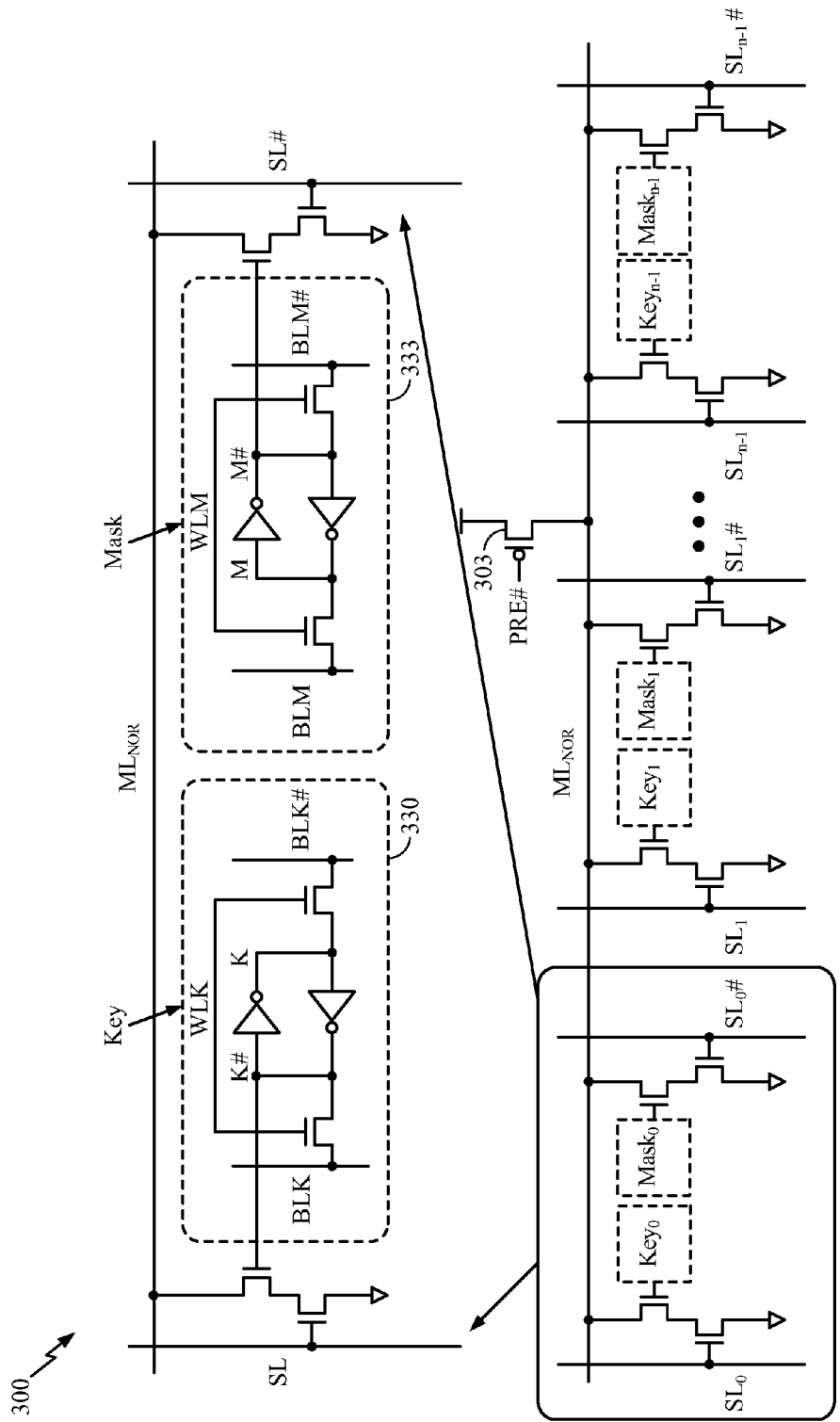
FIG. 3 illustrates a prior art dynamic NOR architecture.

Because the first PMOS transistor 612 and second PMOS transistor 614 are coupled to each cell pair, the match line is not pre-charged before each clock cycle. Therefore, the static NAND TCAM 600 does not use a complex timing control scheme and saves more power in comparison to a dynamic NAND TCAM (FIG. 3). Moreover, the intermediate match lines are not pre-charged to a $V_{DD}$-$V_t$ voltage level, thereby providing a decrease in area and a decrease in power consumption for the search line.

TABLE 3 shows a truth table for the static NAND according to an aspect of the present disclosure.

TABLE 3

| State | Mask Bit (M) | Key Bit (K) | Search Line (SL) | XNOR | ML$_i$ → ML$_{i+1}$ Propagation | ML$_{NAND}$ |
|---|---|---|---|---|---|---|
| 0 | 1 | 0 | 0 | 1 | ON | 0/1 |
| 0 | 1 | 0 | 1 | 0 | OFF | 1 |
| 1 | 1 | 1 | 0 | 0 | OFF | 1 |
| 1 | 1 | 1 | 1 | 1 | ON | 0/1 |
| X | 0 | X | X | X | ON | 0/1 |

As previously discussed, the static NAND TCAM is a serial operation because a current intermediate match line, such as ML$_i$, may only be pulled low when all of the intermediate match lines to the left of the current intermediate match line evaluate low to indicate a match. Likewise, the subsequent intermediate match line ML$_{i+1}$ may only be pulled low if the current intermediate match line ML$_i$ evaluates low. That is, if one intermediate match line indicates a mismatch, the subsequent match lines (the intermediate match lines to the right of the one intermediate match line) are not pulled low. More specifically, a subsequent intermediate match line, such as $ML_{i+1}$, may only be pulled low when the all of the previous intermediate match lines evaluate low to indicate a match.

Furthermore, in the static NAND TCAM, in contrast to the dynamic NAND TCAM, because the match line output $ML_{NAND}$ is connected to the serial PMOS transistors (e.g., first PMOS transistor 612 and second PMOS transistor 614), the $ML_{NAND}$ value is not a float value when there is a mismatch, rather, the serial PMOS transistors pull the match line output $ML_{NAND}$ high to indicate the mismatch. Moreover, the intermediate match lines are serially connected and the state of the match line output $ML_{NAND}$ is not known until all the match lines are evaluated or until a mismatch is determined Therefore, as shown in TABLE 3, in cases when the output is not yet known, the match line output $ML_{NAND}$ will be either 0/1 when a mismatch has not yet been determined.

Furthermore, as shown in TABLE 3, a propagation from a current intermediate match line $ML_i$ to a subsequent intermediate match line $ML_{i+1}$ ($ML_i \rightarrow ML_{i+1}$ propagation) may activate (ON) when either the XNOR is 1 or the mask bit (M) is 0. That is, when the XNOR is 1, a key NMOS transistor 602 is activated and pulls the current intermediate match line $ML_i$ low to indicate a match. Alternatively, when the mask bit (M) is 0, the mask bit bar (M#) of the mask cell will be 1 and a mask NMOS transistor 604 is activated and pulls the current intermediate match line $ML_i$ low to indicate a match. As shown in TABLE 3, when the mask bit is 0, the state of the other variables is X because the current intermediate will pull low to indicate a match regardless of the other values, such as the State, the Key Bit, and the Search Line. More specifically, the state of X refers to a mask state in which there is neither a match nor a mismatch, rather, there is no comparison between the value of the search line and the values key cell.

Additionally, a mismatch is indicated when the XNOR is 0 and the mask bit (M) is 1. Although not shown in TABLE 3, the mask bit bar (M#) is 0 when the mask bit is 1 and vice versa. That is, when XNOR is 0 the XNOR line ($XNOR_0$-$XNOR_{n-1}$) is also 0. Furthermore, when the mask bit bar is 0 (e.g., mask bit is 1), the mask bit bar line ($M_0\#$-$M_{n-1}\#$) is 0. Thus, when both the XNOR line and the mask bit bar line are 0, the first PMOS transistor 612 and second PMOS transistor 614 are enabled and set the match line output ($ML_{NAND}$) to high. As previously discussed, a mismatch is indicated when the match line is high.

Finally, in TABLE 3, the state refers to the state of a storage element (key cell and mask cell). The state is 0 when the key cell has a value of 0; the state is 1 when the key cell has a value of 1; and the state is X when the mask cell is 0. That is, for the state of X, when the mask cell is 0, the mask NMOS transistor 604 is enabled and pulls the intermediate match line to low regardless of the XNOR value.

TABLE 4 illustrates a truth table for a static NAND TCAM. It should be noted that the state in TABLE 4 refers to the state of a storage element (the combination of a key bit cell and a mask bit cell). The state is 0 when the key cell has a value of 0, the state is 1 when the key cell and mask cell have a value of 1, and the state is X when the key cell is in state X. The state of X refers to a mask state in which there is neither a match nor a mismatch. Rather, there is no comparison between the value of the search line and the values of the key cell. Thus, the match line always indicate a match.

TABLE 4

| State | Mask Bit (M) | Key Value (K) |
|---|---|---|
| 0 | 1 | 0 |
| 1 | 1 | 1 |
| X | 0 | X |

A comparison between TABLE 1 (pseudo-NOR TCAM truth table) and TABLE 4 (static NAND TCAM truth table) shows that the state bit for each type of TCAM varies based on the key bits and mask bits. That is, the pseudo-NOR TCAM truth table (TABLE 1) is not the same as the static NAND TCAM truth table (TABLE 4).

Figure 7A:
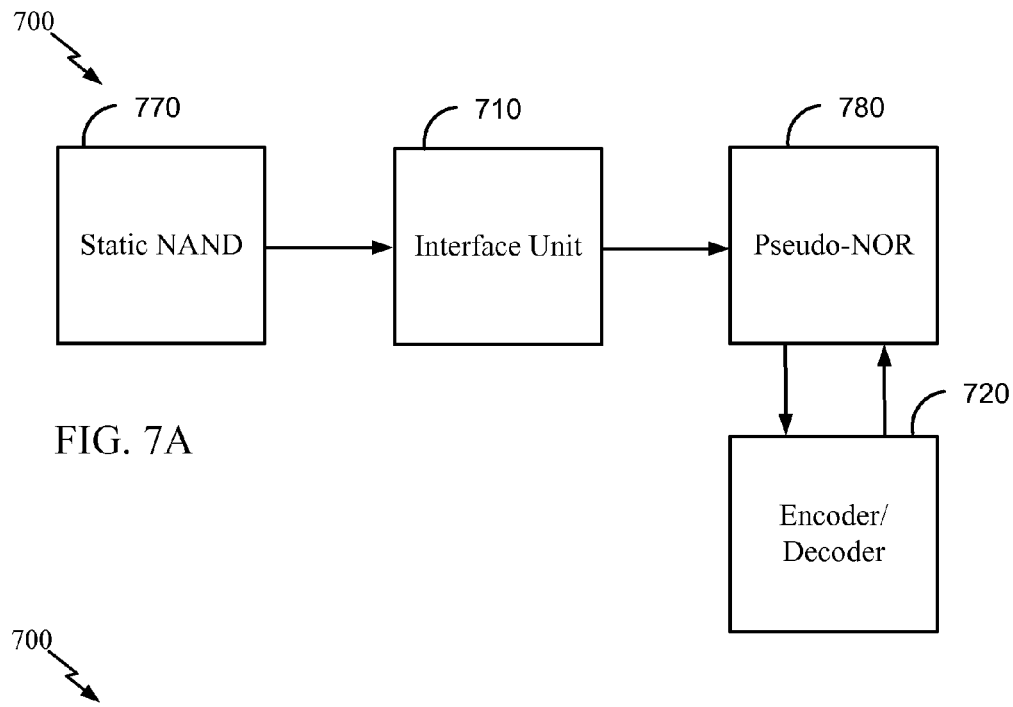
FIGS. 7A and 7B illustrate a hybrid TCAM architecture according to an aspect of the present disclosure.
Figure 7B:
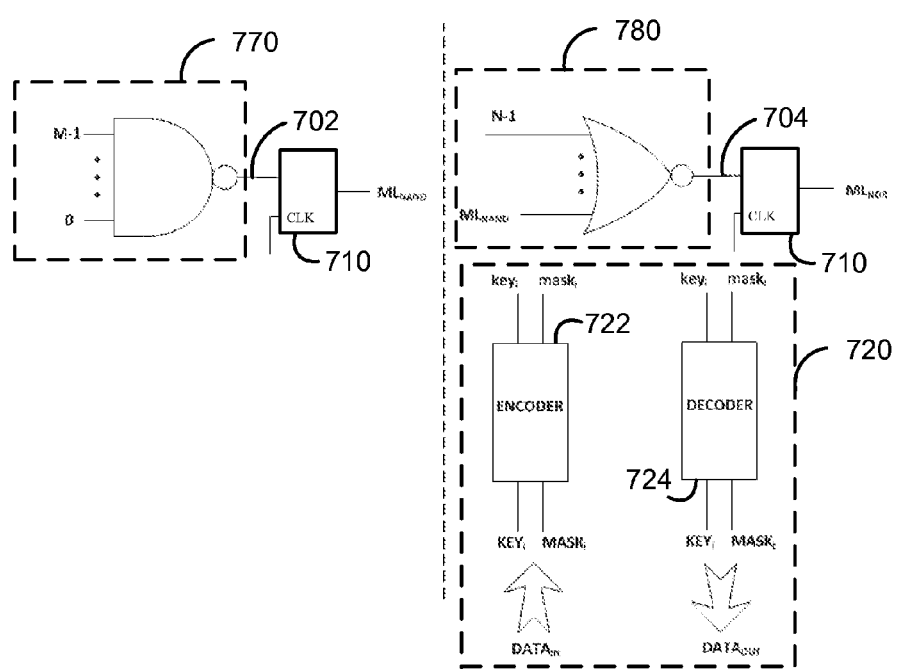

FIG. 7A and FIG. 7B illustrate a hybrid TCAM 700 according to aspects of the present disclosure. As illustrated in FIG. 7A and FIG. 7B, the hybrid TCAM 700 includes a static NAND TCAM 770, an interface unit 710, and a pseudo-NOR TCAM 780. The static NAND TCAM 770 is a symbolic representation of a static NAND TCAM, specifically, the static NAND TCAM 770 of FIGS. 7A and 7B is a logical representation of the static NAND TCAM 600 of FIG. 6. Moreover, the pseudo-NOR TCAM 780 is a symbolic representation of the pseudo-NOR TCAM, specifically, the pseudo-NOR TCAM 780 is a logical representation of the pseudo-NOR TCAM stages 400A, 400B, and 500 of FIGS. 4 and 5.

In one configuration, the first value (M) of a TCAM is compared via the static NAND TCAM 770. Furthermore, the remaining values (N-M) are compared at the pseudo-NOR TCAM 780. The interface unit 710 is specified to interface the static NAND TCAM 770 with the pseudo-NOR TCAM 780. The static NAND TCAM 770 may be referred to as a static NAND stage, and the pseudo-NOR TCAM 780 may be referred to as a pseudo-NOR stage.

In a static NAND TCAM, matches consume more power than mismatches. That is, mismatches consume little to no power. Alternatively, in a pseudo-NOR TCAM, a mismatch shuts off the PMOS stack of a subsequent pseudo-NOR TCAM stage and hence consumes no power. Still, when the PMOS stack of a pseudo-NOR TCAM stage is active, mismatches consume more power than matches.

A longest prefix match (LPM) algorithm is typically used for packet forwarding in routers. The longest prefix matching has more mask values that result in matches in the most significant bits (MSBs) than in the least significant bits (LSBs). Accordingly, the use of a hybrid TCAM for longest prefix matching results in a reduced power consumption for a TCAM.

The TCAM power may be divided into two categories. The first category may be the match line power. Most values are screened in the first M values at the static NAND. Thus, when there is a mismatch, the comparison operation is discontinued for the subsequent (N-M) pseudo-NOR stages, and therefore, the match line power may be reduced.

The second category may be the search line power. The static NAND search lines consume more power than the pseudo-NOR search lines. Because only M values are compared at the static NAND stage, the remaining values (N-M) are compared at the pseudo-NOR stage, and therefore, the overall search line power consumption is reduced.

As discussed above, the pseudo-NOR TCAM is faster in comparison to the static NAND TCAM. The hybrid TCAM uses (N-M) bits in the pseudo-NOR TCAM. Thus, to improve performance in a hybrid TCAM, the number of M bits is within a threshold so that the number of (N-M) bits is sufficiently greater than the number of M bits.

Still, in order to use a hybrid TCAM 700 an interface unit 710 is specified to interface the static NAND stage 770 with the pseudo-NOR stage 780. The interface unit 710 provides the output of the static NAND stage 770 to an input of the pseudo-NOR stage 780. As illustrated in FIG. 7B, the interface unit 710 may be a flip-flop gate receiving the match line output 702 of the static NAND stage 770. The interface unit 710 may also receive a clock input CLK. The interface unit 710 outputs a match line NAND bit $ML_{NAND}$ to the pseudo-NOR stage 780. The pseudo-NOR stage 780 receives the match line NAND bit $ML_{NAND}$ and the N-M values as inputs. The pseudo-NOR stage 780 outputs a match line output 704 to an interface unit 710 and the interface unit output the match line NOR $ML_{NOR}$.

Furthermore, in one configuration, the static NAND stage 770 and the pseudo-NOR stage 780 receive mask bits and key bits in parallel. In one configuration, the input bits ($DATA_{IN}$) may be based on the truth table (TABLE 4) for the static NAND stage 770. Because the truth table (TABLE 1) for the pseudo-NOR stage 780 is different from the truth table (TABLE 4) for the static NAND stage 770, an encoder/decoder is specified for the pseudo-NOR stage 780 so that the mask bits and key bits input via the $DATA_{IN}$ match the pseudo-NOR truth table (TABLE 1).

Furthermore, during a read operation, the decoder 724 decodes the mask bits and key bits output from the pseudo-NOR stage 780 so that the mask bits and key bits in the $DATA_{OUT}$ stream match the truth table (TABLE 4) of the static NAND stage 770. The encoder/decoder 720 includes an encoder 722 and a decoder 724. In another configuration, the encoder/decoder 720 may be connected to the static NAND stage 770 to encode/decode the input/output bits based on the pseudo-NOR truth table (TABLE 1).

According to an aspect of the present disclosure, the key bit may be encoded based on the following equation:

$$\text{KEY(encoded)} = K + \overline{M} \quad (1)$$

where K is the key bit and M is the mask bit.

Furthermore, the mask bit may be encoded based on the following equation:

$$\text{MASK(encoded)} = \overline{K} \cdot \overline{M} \quad (2)$$

Moreover, the key bit may be decoded based on the following equation:

$$\text{KEY(decoded)} = K \quad (3)$$

Finally, the mask bit may be decoded based on the following equation $$\text{MASK(decoded)} = \overline{K} \cdot M + K \cdot \overline{M} = K \otimes M \quad (4)$$

According to one configuration, the encoding may be performed during a write operation to the pseudo-NOR or static NAND and the decoding may be performed during a read operation from the pseudo-NOR or static NAND.

Furthermore, based on aspects of the present disclose, during the encoding and decoding, the key value may be lost if it is originally masked. That is, as an example, for state 0 of a static NAND TCAM, the mask bit (M) is 1 and the key value (K) is 0. After encoding, the mask bit is 1 and the key value is 0. After decoding, the mask bit is 1 and the key value is 0. In this example, the key value was not lost.

In another example, for a state of X of a static NAND TCAM, the mask bit is 0 and the key value may be 0. In this example, after encoding, the key value is one and the mask bit is 1. Furthermore, in this example, after decoding, the key value is one and the mask bit is 0. Accordingly, in the process of encoding and decoding, the key value was lost. Still, because the key value is not used in a state of X, when the state is X, the key value may be lost during the encoding and decoding process without affecting the hybrid TCAM.

Figure 8:
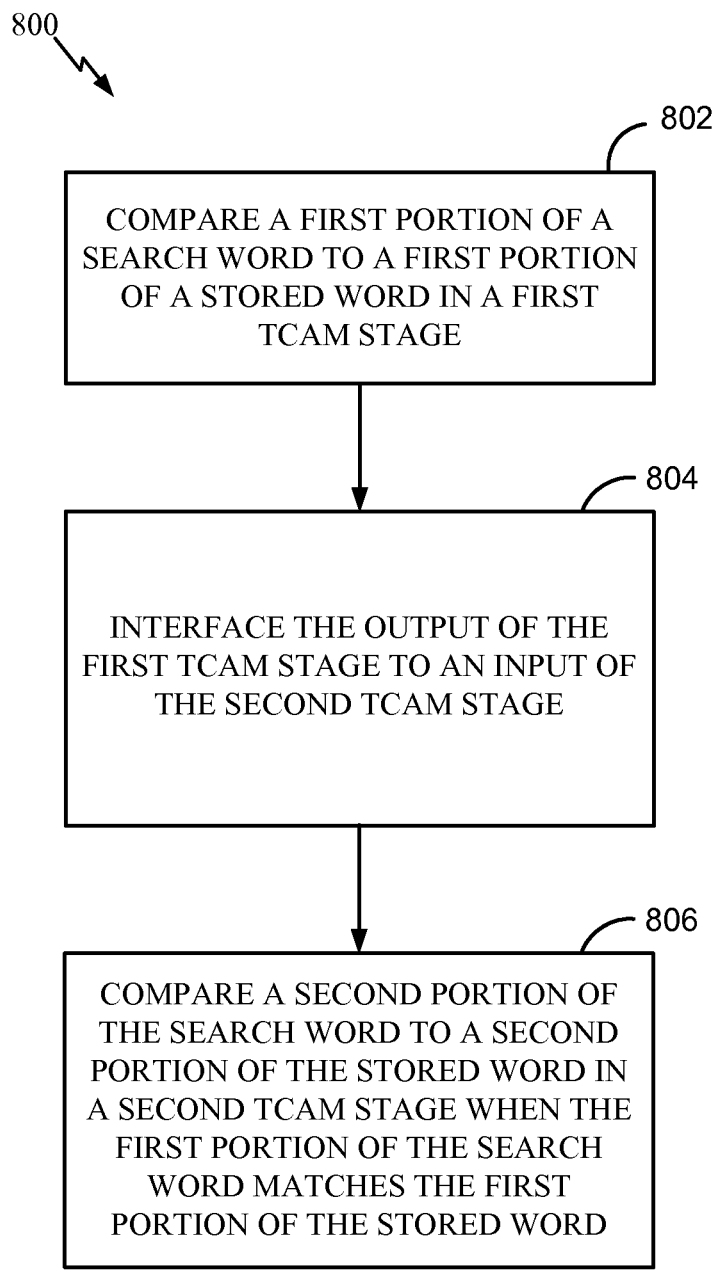
FIG. 8 is a flow chart illustrating a method for operating the hybrid TCAM architecture of FIGS. 7A and 7B according to an aspect of the present disclosure.

FIG. 8 illustrates a block diagram of a method within a hybrid TCAM 800. As illustrated in FIG. 8, in block 802, a first TCAM stage compares a first portion of a search word to a first portion of a stored word. In block 804, the output of the first TCAM stage is interfaced to an input of the second TCAM stage. In block 806, a second TCAM stage compares a second portion of the search word to a second portion of the stored word in a second TCAM stage when the first portion of the search word matches the first portion of the stored word.

Figure 9:
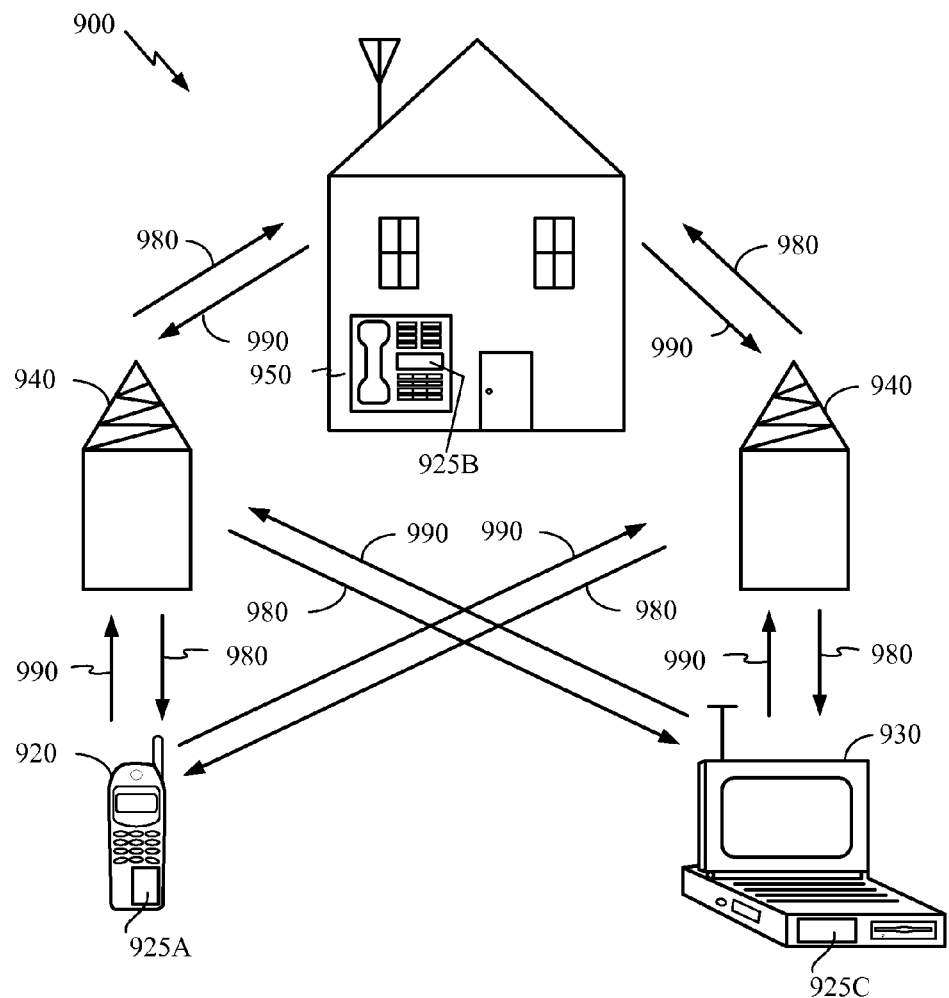
FIG. 9 illustrates an exemplary wireless communication system in which an embodiment of the disclosure may be advantageously employed.

FIG. 9 shows an exemplary wireless communication system 900 in which an embodiment of the disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include multi-core processors with a hybrid TCAM 925A, 925B, and 925C. FIG. 9 shows forward link signals 980 from the base stations 940 and the remote units 920, 930, and 950 and reverse link signals 990 from the remote units 920, 930, and 950 to base stations 940.

In FIG. 9, the remote unit 920 is shown as a mobile telephone, remote unit 930 is shown as a portable computer, and remote unit 950 is shown as a fixed location remote unit in a wireless local loop system. For example, the remote units may be cell phones, hand-held personal communication systems (PCS) units, a set top box, a music player, a video player, an entertainment unit, a navigation device, portable data units, such as personal data assistants, or fixed location data units such as meter reading equipment. Although FIG. 9 illustrates remote units, which may employ multi-core processors with a hybrid TCAM 925A, 925B, and 925C according to the teachings of the disclosure, the disclosure is not limited to these exemplary illustrated units. For instance, multi-core processors with a hybrid TCAM according to aspects of the present disclosure may be suitably employed in any device.

Figure 10:
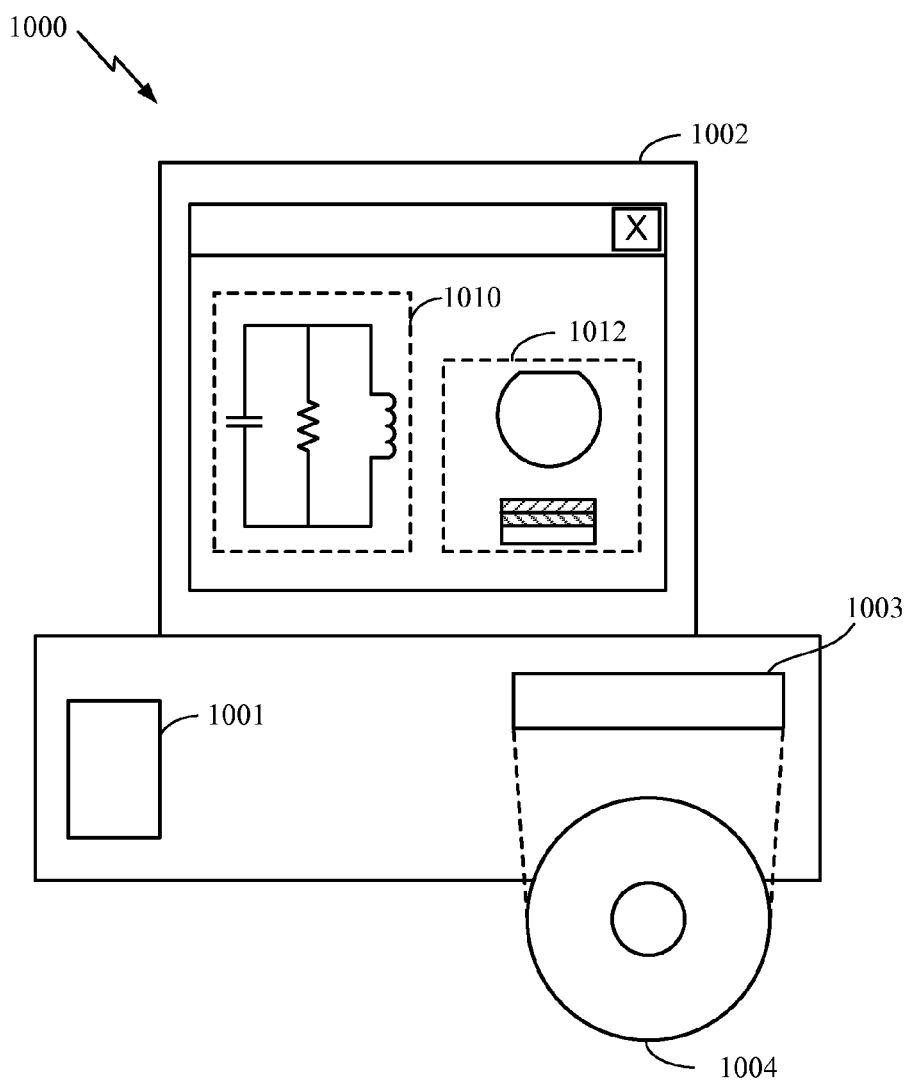
FIG. 10 is a block diagram illustrating a design workstation used for circuit, layout, and logic design of a semiconductor component according to one aspect of the present disclosure.

FIG. 10 is a block diagram illustrating a design workstation used for circuit, layout, and logic design of a semiconductor component, such as the multi-core processor with a hybrid TCAM disclosed above. A design workstation 1000 includes a hard disk 1001 containing operating system software, support files, and design software such as Cadence or OrCAD. The design workstation 1000 also includes a display 1002 to facilitate design of a circuit 1010 or a semiconductor component 1012 such as a hybrid TCAM. A storage medium 1004 is provided for tangibly storing the circuit design 1010 or the semiconductor component 1012. The circuit design 1010 or the semiconductor component 1012 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit design 1010 or the semiconductor component 1012 by decreasing the number of processes for designing semiconductor wafers.

In one configuration, the TCAM includes comparing means. The comparing means may be the static NAND TCAM stage 770 and/or the pseudo NOR TCAM 780 configured to perform the functions recited by the comparing means. In one configuration, the TCAM also includes an interface means, the interface means may be the interface unit 710 configured to perform the functions recited by the interface means. In another configuration, the TCAM also includes an encoding means and a decoding means. The encoding means and the decoding means may be the encoder/decoder 720 configured to perform the functions recited by the encoding means and the decoding means.

Although specific circuitry has been set forth, it will be appreciated by those skilled in the art that not all of the disclosed circuitry is required to practice the disclosed embodiments. Moreover, certain well known circuits have not been described, to maintain focus on the disclosure.

The methodologies described herein may be implemented by various means depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine or computer readable medium tangibly embodying instructions may be used in implementing the methodologies described herein. For example, software code may be stored in a memory and executed by a processor. When executed by the processor, the executing software code generates the operational environment that implements the various methodologies and functionalities of the different aspects of the teachings presented herein. Memory may be implemented within the processor or external to the processor. As used herein, the term "memory" refers to any type of long term, short term, volatile, nonvolatile, or other memory and is not to be limited to any particular type of memory or number of memories, or type of media upon which memory is stored.

The machine or computer readable medium that stores the software code defining the methodologies and functions described herein includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. As used herein, disk and/or disc includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present teachings and their advantages have been described in detail, it should be understood that various changes, substitutions and alterations can be made herein without departing from the technology of the teachings as defined by the appended claims. Moreover, the scope of the present application is not intended to be limited to the particular aspects of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding aspects described herein may be utilized according to the present teachings. Accordingly, the appended claims are intended to include within their scope such processes, machines, manufacture, compositions of matter, means, methods, or steps.

What is claimed is:

1. A method within a hybrid ternary content addressable memory (TCAM), the method comprising:
   comparing a first portion of a search word to a first portion of a stored word in a first TCAM stage; and
   comparing a second portion of the search word to a second portion of the stored word in a second TCAM stage when the first portion of the search word matches the first portion of the stored word, the first portion of the search word being different than the second portion of the search word, and the first TCAM stage being configured as a first type TCAM and the second TCAM stage being configured as a second type TCAM, the first type TCAM being different than the second type TCAM.

2. The method of claim 1 further comprising encoding mask bits and key bits at the second TCAM stage during a write operation, the encoding comprising translating the mask bits and the key bits from values used for the first TCAM stage to values used for the second TCAM stage.

3. The method of claim 1 further comprising decoding mask bits and key bits at the second TCAM stage during a read operation, the decoding comprising translating the mask bits and the key bits from values used for the second TCAM stage to values used for the first TCAM stage.

4. The method of claim 1, further comprising interfacing an output of the first TCAM stage to an input of the second TCAM stage.

5. The method of claim 1, in which the first type TCAM comprises a static NAND and the second type TCAM comprises a pseudo NOR.

6. The method of claim 1, in which the first type TCAM comprises a pseudo NOR and the second type TCAM comprises a static NAND.

7. A hybrid ternary content addressable memory (TCAM), comprising:
   a first TCAM stage configured to compare a first portion of a search word to a first portion of a stored word; and
   a second TCAM stage configured to compare a second portion of the search word to a second portion of the stored word when the first portion of the search word matches the first portion of the stored word, the first portion of the search word being different than the second portion of the search word, and the first TCAM stage being configured as a first type TCAM and the second TCAM stage being configured as a second type TCAM, the first type TCAM being different than the second type TCAM.

8. The TCAM of claim 7, further comprising an encoder configured to encode mask bits and key bits at the second TCAM stage during a write operation, the encoding comprising translating the mask bits and the key bits from values used for the first TCAM stage to values used for the second TCAM stage.

9. The TCAM of claim 7, further comprising a decoder configured to decode mask bits and key bits at the second TCAM stage during a read operation, the decoding comprising translating the mask bits and the key bits from values used for the second TCAM stage to values used for the first TCAM stage.

10. The TCAM of claim 7, further comprising an interface unit configured to interface an output of the first TCAM stage to an input of the second TCAM stage.

11. The TCAM of claim 7, in which the first type TCAM comprises a static NAND and the second type TCAM comprises a pseudo NOR.

12. The TCAM of claim 7, in which the first type TCAM comprises a pseudo NOR and the second type TCAM comprises a static NAND.

13. A hybrid ternary content addressable memory (TCAM), comprising:
a first means for comparing a first portion of a search word to a first portion of a stored word; and
a second means for comparing a second portion of the search word to a second portion of the stored word when the first portion of the search word matches the first portion of the stored word, the first portion of the search word being different than the second portion of the search word, and the first means for comparing being configured as a first type TCAM and the second means for comparing being configured as a second type TCAM, the first type TCAM being different than the second type TCAM.

14. The TCAM of claim 13, further comprising a means for encoding mask bits and key bits at the second means for comparing during a write operation, the encoding comprising translating the mask bits and the key bits from values used for the first means for comparing to values used for the second means for comparing.

15. The TCAM of claim 13, further comprising a means for decoding mask bits and key bits at the second means for comparing during a read operation, the decoding comprising translating the mask bits and the key bits from values used for the second means for comparing to values used for the first means for comparing.

16. The TCAM of claim 13, further comprising a means for interfacing an output of the first for comparing to an input of the second for comparing.

17. The TCAM of claim 13, in which the first type TCAM comprises a static NAND and the second type TCAM comprises a pseudo NOR stage.

18. The TCAM of claim 13, in which the first type TCAM comprises a pseudo NOR and the second type TCAM comprises a static NAND.

19. The TCAM of claim 7, wherein the search word consists of N values, the first portion of the search word consists of M values, and the second portion of the search word consists of N-M values.

20. The TCAM of claim 19, wherein the second type TCAM is faster in evaluating comparisons than the first type TCAM.

21. The TCAM of claim 20, wherein N-M is greater than M.

22. The TCAM of claim 7, wherein the first TCAM stage is configured to consume more power evaluating comparisons as matches than evaluating comparisons as mismatches, and wherein the second TCAM stage is configured to consume more power evaluating comparisons as mismatches than evaluating comparisons as matches.

23. The TCAM of claim 22, wherein the comparison of the first portion of the search word to the first portion of the stored word statistically yields more mismatches than the comparison of the second portion of the search word to the second portion of the stored word.

24. The TCAM of claim 7, wherein the second TCAM stage comprises at least first and second cascaded comparison stages, wherein the second cascaded comparison stage comprises:
an input circuit configured to:
receive an input signal from the first cascaded comparison stage;
apply a high logic voltage to a node in response to the input signal indicating a match of a first subset of the second portion of the search word with a corresponding first subset of the second portion of the search word; and
apply a low logic voltage to the node in response to the input signal indicating a mismatch of the first subset of the second portion of the search word with the corresponding first subset of the second portion of the search word;
a comparison circuit configured to:
change the high logic voltage at the node to the low logic voltage in response to a mismatch being determined between a second subset of the second portion of the search word with a corresponding second subset of the second portion of the search word; and
maintain the high logic voltage at the node in response to a match being determined between the second subset of the second portion of the search word with the corresponding second subset of the second portion of the search word;
an inverting circuit configured to logically invert the resulting high logic voltage or the low logic voltage at the node, wherein the inverted high logic voltage or the inverted low logic voltage is produced at an output of the second TCAM stage or is applied to an input of a following cascaded comparison stage.

25. The TCAM of claim 24, wherein the comparison circuit comprises one or more comparison stages, wherein each comparison stage comprises:
a first pull-down circuit configured to:
change the high logic voltage at the node to the low logic voltage in response to a mismatch between a value of the second subset of the second portion of the search word and a corresponding value of the second subset of the second portion of the stored word; and
maintain the high logic voltage at the node in response to a match between the value of the second subset of the second portion of the search word and the corresponding value of the second subset of the second portion of the stored word; and
a second pull-down circuit configured to:
change the high logic voltage at the node to the low logic voltage in response to a match between the value of the second subset of the second portion of the search word and a corresponding mask value; and maintain the high logic voltage at the node in response to a mismatch between the value of the second subset of the second portion of the search word and the corresponding mask value.

26. The TCAM of claim 7, wherein the first TCAM stage comprises a plurality of cascaded comparison stages coupled between an output and ground, wherein at least one of the cascaded comparison stage comprises:

at least one switching element; and a comparison circuit configured to close the at least one switching element to couple adjacent cascaded comparison stages together in response to a match between a value of the first portion of the search word and a corresponding value of the first portion of the stored word.

27. The TCAM of claim 26, wherein the at least one of the cascaded comparison stage further comprises a mismatch indicating circuit configured to generate a mismatch indication at the output in response to the comparison circuit indicating a mismatch between the value of the first portion of the search word and the corresponding value of the first portion of the stored word.

28. The TCAM of claim 26, wherein the at least one of the cascaded comparison stage comprises a mask cell configured to:

generate a mask value; and close the at least one switching element in response to the mask value being asserted.

29. The TCAM of claim 28, wherein the at least one of the cascaded comparison stage further comprises a mismatch indicating circuit configured to generate a mismatch indication at the output in response to the comparison circuit indicating a mismatch between the value of the first portion of the search word and the corresponding value of the first portion of the stored word, and the mask value being de-asserted.

* * * * *